(12) United States Patent
Baney et al.

(10) Patent No.: US 7,008,855 B2
(45) Date of Patent: Mar. 7, 2006

(54) GLASS FRIT BOND AND PROCESS THEREFOR

(75) Inventors: William J. Baney, Kokomo, IN (US); Brenda B. Baney, Kokomo, IN (US); Heather Hude, Atlanta, GA (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/955,363

(22) Filed: Sep. 30, 2004

(65) Prior Publication Data

US 2005/0058841 A1   Mar. 17, 2005

Related U.S. Application Data

(62) Division of application No. 10/248,503, filed on Jan. 24, 2003, now Pat. No. 6,815,071.

(51) Int. Cl.
*H01L 21/46* (2006.01)

(52) U.S. Cl. ............... 438/406; 438/455; 438/118; 428/426; 428/432

(58) Field of Classification Search ............... None
See application file for complete search history.

(56) References Cited

U.S. PATENT DOCUMENTS 4,079,022 A    3/1978  Ferrarini et al.
6,737,375 B1 * 5/2004  Buhrmaster et al. .......... 501/47

* cited by examiner

*Primary Examiner*—Dung A. Le
(74) *Attorney, Agent, or Firm*—Stefan V. Chmielewski

(57) ABSTRACT

A lead-containing glass material of the type suitable for use in a wafer bonding process, wherein the moisture resistance of the glass material is increased by the presence of a lead phosphate coating on an outer exposed surface of the material, thereby acting as a barrier to reaction of moisture with the lead of the glass material. A source of reactive phosphate ions is applied to the glass material so as to spontaneously form the desired lead phosphate coating.

19 Claims, 1 Drawing Sheet

GLASS FRIT BOND AND PROCESS THEREFOR

CROSS REFERENCE TO RELATED APPLICATIONS

This application is a Div of Ser. No. 10/248,503 Jan. 24, 2003 U.S. Pat. No. 6,815,071.

STATEMENT REGARDING FEDERALLY SPONSORED RESEARCH

Not applicable.

BACKGROUND OF THE INVENTION (1) Field of the Invention

The present invention generally relates to glass frit compositions. More particularly, this invention relates to lead-containing glass frit materials of the type suitable for use in wafer bonding processes, wherein the moisture resistance of the glass frit material after firing is increased by a lead phosphate coating formed on an exposed outer surface of the glass frit material.

(2) Description of the Related Art

Within the semiconductor industry, there are numerous applications that require bonding a semiconductor wafer to a second wafer or glass substrate. As an example, a microelectromechanical system (MEMS) device formed in or on a semiconductor wafer (referred to herein as a device wafer) is often capped by a semiconductor or glass wafer (referred to herein as a capping wafer), forming a package that defines a cavity within which the MEMS device, such as a suspended diaphragm or mass, is enclosed and protected. Examples of MEMS devices protected in this manner include accelerometers, rate sensors, actuators, pressure sensors, etc. By the very nature of their operation, MEMS devices must be free to move to some degree, necessitating that the seal between the wafers is sufficient to exclude foreign matter from the cavity. Certain MEMS devices, such as absolute pressure sensors, further require that the cavity be evacuated and hermetically sealed. The performance of motion sensors and accelerometers with resonating micromachined components also generally benefit if the cavity is evacuated so that their micromachined components operate in a vacuum. A hermetical seal also ensures that moisture is excluded from the cavity, which might otherwise form ice crystals at low temperatures that could impede motion of the MEMS device.

In view of the above, the integrity of the bond that secures the capping wafer to the device wafer is essential to the performance and life of the enclosed MEMS device. Various bonding techniques have been used for the purpose of maximizing the strength and reliability of the wafer bond. Such techniques include the use of various intermediate bonding materials, including glass frit, as well as silicon direct and anodic bonding techniques that do not require an intermediate bonding material. As would be expected, each of these bonding techniques can be incompatible or less than ideal for certain applications. Silicon direct and anodic bonding methods require very smooth bonding surfaces, and therefore cannot produce a vacuum seal when trench isolation or unplanarized metal crossunders are employed on the device wafer, such as to electrically interconnect a MEMS device to bond pads outside the vacuum-sealed cavity of the package. In contrast, glass frit and other intermediate bonding materials are able to form suitable bonds with deposited layers, runners and other surface discontinuities often found on device wafers.

Glass frit bonding materials used for wafer bonding are often deposited by a screen printing technique, in which case the material is deposited as a paste that contains a particulate glass frit material, a thixotropic binder, and a solvent for the binder. The proportions of glass frit, binder and solvent are adjusted to allow screen printing of a controlled volume of the paste on a designated bonding surface of one of the wafers, typically on the capping wafer. After firing, the capping and device wafers are aligned and then mated so that the glass frit particles (bonded together as a result of the firing operation) contact a complementary bonding surface of the second (e.g., device) wafer. The wafers are then incrementally heated to completely remove the solvent and binder and finally melt the glass frit, so that on cooling the glass frit material resolidifies to form a substantially homogeneous glass bond line between the wafers.

The composition and size of a glass frit material used in a wafer bonding process are typically chosen on the basis of process and compositional considerations, including screening properties, process temperatures, etc. Suitable glass frit materials are usually a mixture of various oxides, such as litharge (PbO; also known as lead oxide, yellow and lead monoxide), boric acid ($H_3BO_3$) which serves as a source for boron oxide ($B_2O_3$), silicon dioxide ($SiO_2$; silica), aluminum oxide ($Al_2O_3$, alumina), titanium oxide ($TiO_2$, titania), cupric oxide (CuO), manganese dioxide ($MnO_2$) or manganese carbonate ($MnCO_3$) as a source for manganous oxide (MnO), calcia (CaO), lithium oxide ($Li_2O$), ceria ($CeO_2$), cobaltous carbonate ($CoCO_3$), and others. Glass frits that contain lead are widely used in the semiconductor industry to enable silicon wafer bonding at temperatures sufficiently low to reduce the risk of thermal damage. However, the percentage of lead required in a glass frit material to achieve high quality wafer-level sealing at low firing temperatures makes the resulting glass susceptible to attack by moisture. When a lead-containing glass is exposed to moisture, lead can be released from the glass and, in concert with moisture, migrate to exposed aluminum metallization on the wafer, resulting in galvanic corrosion of the metallization. This corrosion is a source of concern for both the wafer-level yield and the system-level reliability of a semiconductor device.

Prolonged exposure to moisture can also create holes in a glass bond line that are potential paths for the ingress of air, moisture and contaminants into a cavity sealed by the bond line. Glass frit used in wafer bonding processes is often exposed to attack by moisture as a result of the use of water to cool the wafers and remove debris during the dicing operation used to singulate dies from the wafers. During singulation, the glass bond line is generally covered by water for the duration of the dicing operation, making the glass-water interaction difficult to avoid. Following dicing, if the device is placed in a package that is not hermetically sealed, the glass bond line may be subjected to prolonged exposure to moisture during the operating life of the device.

In view of the above, it would be desirable if lead-containing glass frit materials of the type used in wafer bonding processes could be rendered more resistance to attack by moisture.

BRIEF SUMMARY OF THE INVENTION

The present invention is directed to lead-containing glass frit materials of the type suitable for use in wafer bonding processes, wherein the moisture resistance of the glass frit material is increased by the presence of one or more lead phosphate compounds. The lead phosphate compounds are preferably in the form of an outer coating that protects the surface of the glass frit material, thereby acting as a barrier to reaction of moisture with the lead contained by the material.

A suitable method for making and using the glass frit material of this invention comprises depositing the lead-containing glass frit material on a surface. The glass frit material, comprising glass frit particles, is then fired to melt and fuse (bond) the particles, after which a source of reactive phosphate ions is applied to the bonded glass frit so as to spontaneously form the desired lead phosphate coating on the exposed surface of the glass frit.

Glass frit materials protected with a lead phosphate coating in accordance with this invention are particularly well suited for bonding device and capping chips together, such as where the glass frit material is used to hermetically seal a cavity defined by and between the device chip and the capping chip. In such an application, the lead phosphate coating prevents the lead content of the glass frit material from reacting with moisture, such that lead is not released to react with aluminum metallization on the chips and create holes that would degrade the hermetical seal formed by the glass frit material.

Other objects and advantages of this invention will be better appreciated from the following detailed description.

DETAILED DESCRIPTION OF THE INVENTION

Figure 1:
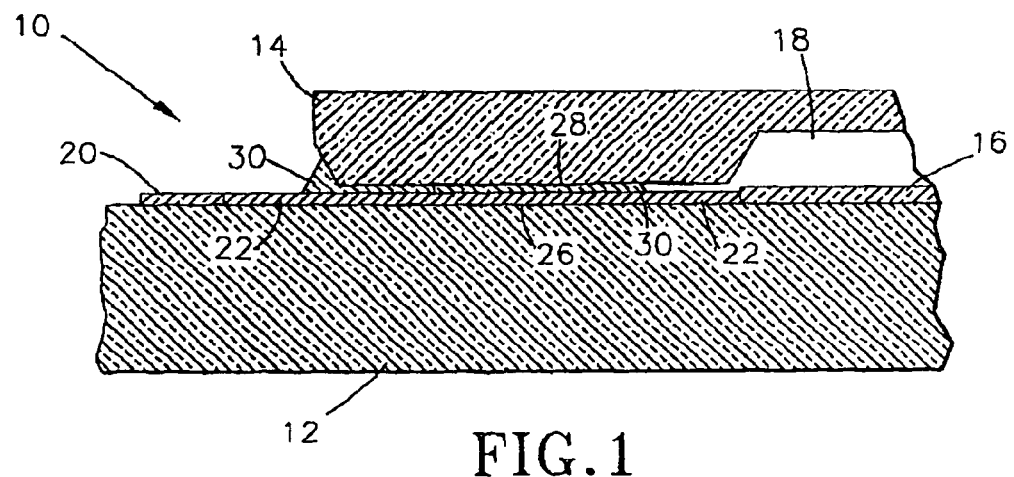
FIG. 1 is a cross-sectional view of a MEMS device package that includes a capping wafer glass frit bonded to a device wafer in accordance with this invention.

FIG. 1 represents a portion of a MEMS device package 10 formed by glass frit bonding a device wafer 12 to a capping wafer 14, such that a micromachined structure 16 (schematically represented in FIG. 2) is enclosed within a cavity 18 between the wafers 12 and 14. The device wafer 12 is typically formed of a semiconductor material such as silicon, preferably monocrystallographic silicon, though it is foreseeable that other materials could be used. The capping wafer 14 may be formed of glass, ceramic, or a semiconducting material. The micromachined structure 16 can be of any desired type, such as a proof mass, resonating structure, diaphragm or cantilever that relies on capacitive, piezoresistive and piezoelectric sensing elements to sense acceleration, motion, pressure, etc., all of which are known in the art.

As is conventional, the micromachined structure 16 is electrically interconnected to metal bond pads 20 on the device wafer 12 by conductive runners 22, often in the form of aluminum metallization. Through the bond pads 20, the micromachined structure 16 and its associated sensing elements can be electrically interconnected with appropriate signal conditioning circuitry (not shown), which may be formed on the device wafer 12, the capping wafer 14 or a separate chip. The runners 22 cross through a bonding surface 26 contacted by a glass bond line 30 that bonds a corresponding bonding surface 28 of the capping wafer 14 to the bonding surface 26 of the device wafer 12.

According to common practice, the bond line 30 is formed by firing a paste composition containing a glass frit material and, typically, a binder and solvent. The binder and solvent are removed and the glass frit material is melted by sufficiently heating the paste, with the result that essentially only glass remains to form the bond line 30. Suitable binders and solvents for the paste are those used in commercially-available glass frit paste mixtures, and have vaporization temperatures well below the softening point of glass frit materials suitable for the paste (e.g., about 355° C.). As known in the art, the proportions of the glass frit material, binder and solvent are chosen at least in part to achieve the desired deposition resolution for the paste, and consequently, the minimum width and thickness of the glass bond line 30. A suitable deposition method is screen printing in accordance with known practices, by which the paste is deposited through a mask or screen to form a thick film on the bonding surface 26 or 28 of the device or capping wafer 12 or 14. The wafer 12 or 14 is heated to remove the solvent and binder from the paste, and then soften or melt the surfaces of the glass frit particles to bond or "tack" the particles together. After cooling to resolidify the glass frit material, the capping and device wafers 12 and 14 are aligned and mated so that the glass frit material is between and contacts both bonding surfaces 26 and 28 of the wafers 12 and 14. The wafers 12 and 14 are then heated to a temperature sufficient to remelt the glass frit material, after which the wafers 12 and 14 are cooled to resolidify the glass frit material and form the glass bond line 30 shown between the wafers 12 and 14 in FIG. 1.

The present invention is concerned with glass bonds formed from glass frit compositions that contain lead, such as from lead oxide (PbO), also known as litharge, and yellow and lead monoxide. Various other materials may be present in the frit composition, including but not limited to boric acid ($H_3BO_3$) which serves as a source for boron oxide ($B_2O_3$), silicon dioxide ($SiO_2$; silica), aluminum oxide ($Al_2O_3$, alumina), titanium oxide ($TiO_2$, titania), cupric oxide (CuO), manganese dioxide ($MnO_2$) or manganese carbonate ($MnCO_3$) as a source for manganous oxide (MnO), calcia (CaO), lithium oxide ($Li_2O$), ceria ($CeO_2$), cobaltous carbonate ($CoCO_3$). However, it is the lead content in the glass bond line 30 formed by firing the glass frit that renders the bond line 30 susceptible to attack by moisture. As a result of exposure to moisture, elemental lead can be released from the bond line 30 and migrate to the aluminum runners 22 on the device wafer 12 to cause galvanic corrosion. Lead migration from prolonged exposure to moisture, such as during dicing when the device package 10 is singulated from a wafer stack, can result in the creation of holes in the bond line 30 that are paths for the ingress of air, moisture and contaminants into the cavity 18, which is often required to be hermetically sealed by the bond line 30.

To prevent or at least inhibit the depletion of lead from the bond line 30, a source of reactive phosphate ions is applied to the bond line 30 (i.e., after firing of the glass frit paste), which results in the formation of a lead phosphate coating on the exposed outer surface of the bond line 30. An example of a suitable source of phosphate ions is a surfactant commercially available from Union Carbide under the name Triton X-100, which contains a trace amount of phosphates, believed to be on the order of parts per million or less. The Triton X-100 surfactant has been successfully used in a diluted form by preparing a solution of about five parts by volume of the surfactant to about 95 parts of deionized water, though solutions containing as little as about 2.5 parts by volume of the surfactant, the balance water, are believed to be effective. While the Triton X-100 has been found to be a suitable source of reactive phosphate ions, other sources containing a sufficient amount of reactive phosphates—again, even amounts measured in parts per million (e.g., less than 0.001%) or less—could be used, as long as the source is able to deliver phosphate ions to the glass surface so that lead present in the glass is reacted to form a protective lead phosphate coating.

Phosphate ions are believed to bond with lead through several possible reactions, such as:

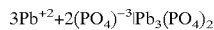

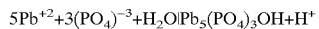

These reactions tie up lead on the surface of the bond line 30 by forming lead phosphates that are highly insoluble in water (log Ksp values of −44.36 and −76.8, respectively). Through these reactions, any lead-containing glass frit material (e.g., bond line 30) will develop a protective coating containing one or more lead phosphates. The lead phosphate coating acts as a moisture barrier to the bulk of the glass frit material, thereby inhibiting attack and greatly decreasing the probability of device failure due to moisture-induced degradation of the glass frit.

During an investigation leading to this invention, a solution was prepared containing the Triton X-100 surfactant and deionized water in a volume ratio of 5/95. Two identical accelerometer packages were obtained having an acceleration-responsive proof mass enclosed within a cavity hermetically sealed with a glass bond, similar to what is depicted in FIG. 1. The glass bond was formed by firing a glass frit material containing lead oxide particles. Both packages also included runners and bond pads formed by aluminum metallization and contacted by the glass bond. One of the packages was treated in accordance with this invention by immersing the package in the surfactant solution for about ten minutes, such that the exposed portions of the glass bond were contacted by the solution. Both packages were then immersed in deionized water at a temperature of about 95° C. for about 2.5 hours.

Examination of the untreated package evidenced that a large amount of lead had been released from the glass bond, and that the aluminum metallizations were darkened by what was determined by energy dispersive x-ray (EDX) analysis to be a layer of lead oxide. In contrast, the glass bond of the treated package did not suffer any discernable loss of lead, and the surfaces of the aluminum metallizations were free of lead oxide contamination. Microphotographs of the glass bond lines of both packages evidenced that the untreated glass bond had a roughened, crystalline appearance with holes attributed to the loss of lead. In contrast, the bond line of the treated package had a smooth texture with a feathery "skin" identified by EDX as phosphorus-rich and attributed to lead phosphates formed by the surfactant treatment. The lead phosphate skin completely covered the exposed surface of the glass bond line. From these results, it was concluded that the lead phosphate coating was present in an amount sufficient to prevent the lead oxide of the glass bond line from reacting with the hot water bath. As such, it was concluded that treating a lead-containing glass frit material with a phosphate-containing source is capable of preventing the loss of lead from the frit material, and therefore capable of avoiding degradation of the glass frit bond and contamination of surrounding die surfaces.

While the invention has been described in terms of a preferred embodiment, it is apparent that other forms could be adopted by one skilled in the art. For example, glass frit material treated in accordance with this invention could be used in a variety of other applications, including displays, etc. Accordingly, the scope of the invention is to be limited only by the following claims.

The invention claimed is:

1. A method comprising the steps of:
    depositing a lead-containing glass frit material on a surface, the glass frit material comprising glass frit particles;
    firing the glass frit material to melt and fuse the particles and form a glass bond; and then
    applying a source of reactive phosphate ions to the glass bond so as to form a lead phosphate coating on the glass bond.

2. The method according to claim 1, wherein the source of reactive phosphate ions is a liquid.

3. The method according to claim 1, wherein the source of reactive phosphate ions is a surfactant.

4. The method according to claim 3, wherein the surfactant is diluted in water.

5. The method according to claim 4, wherein the surfactant and the water are combined to form a solution that contains at least about 2.5 parts by volume of surfactant, the balance essentially water.

6. The method according to claim 1 wherein, prior to the firing step, the glass frit material further comprises at least one material chosen from the group consisting of boric acid, silicon dioxide, aluminum oxide, titanium oxide, cupric oxide, manganese dioxide, manganese carbonate, calcia, lithium oxide, ceria, and cobaltous carbonate.

7. A method according to claim 1 wherein, after the firing step, the glass bond further comprises at least one material chosen from the group consisting of boron oxide, silicon dioxide, aluminum oxide, titanium oxide, cupric oxide, manganous oxide, calcia, lithium oxide, ceria, and cobaltous carbonate.

8. The method according to claim 1 wherein, as a result of the firing step, the glass bond bonds a device chip to a capping chip.

9. The method according to claim 8, wherein the glass bond hermetically seals a cavity defined by and between the device chip and the capping chip.

10. A method of bonding a device wafer to a capping wafer, the method comprising the steps of:
- depositing a glass frit material on a surface of one of the device and capping wafers, the glass frit material comprising glass frit particles, at least some of the particles being formed of a lead oxide;
- firing the glass frit material to melt and fuse the particles and form a glass bond that bonds the device wafer to the capping wafer; and then
- applying a solution containing a source of reactive phosphate ions to the glass bond so as to spontaneously form a lead phosphate coating on the glass bond.

11. The method according to claim 10, wherein the source contains less than about 0.001% by volume of phosphate ions.

12. The method according to claim 10, wherein the source of reactive phosphate ions is a surfactant.

13. The method according to claim 12, wherein the solution comprises water and the surfactant.

14. The method according to claim 13, wherein the solution contains at least about 2.5 parts by volume of surfactant, the balance essentially water.

15. The method according to claim 10 wherein, prior to the firing step, the glass frit material further comprises at least one material chosen from the group consisting of boric acid, silicon dioxide, aluminum oxide, titanium oxide, cupric oxide, manganese dioxide, manganese carbonate, calcia, lithium oxide, ceria, and cobaltous carbonate.

16. A method according to claim 10 wherein, after the firing step, the glass bond further comprises at least one material chosen from the group consisting of boron oxide, silicon dioxide, aluminum oxide, titanium oxide, cupric oxide, manganous oxide, calcia, lithium oxide, ceria, and cobaltous carbonate.

17. The method according to claim 10, wherein the glass bond hermetically seals a cavity defined by and between the device chip and the capping chip.

18. The method according to claim 17, wherein the cavity contains a microelectromechanical device.

19. The method according to claim 10, wherein the device chip has aluminum metallization contacting the glass bond.

* * * * *